United States Patent
Liu et al.

(10) Patent No.: US 10,115,837 B1
(45) Date of Patent: Oct. 30, 2018

(54) INTEGRATED CIRCUITS WITH SOLAR CELLS AND METHODS FOR PRODUCING THE SAME

(71) Applicant: Globalfoundries Singapore Pte. Ltd., Singapore (SG)

(72) Inventors: Bin Liu, Singapore (SG); Eng Huat Toh, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/718,058

(22) Filed: Sep. 28, 2017

(51) Int. Cl.
| | |
|---|---|
| H01L 31/00 | (2006.01) |
| H01L 31/02 | (2006.01) |
| H01L 31/18 | (2006.01) |
| H01L 31/028 | (2006.01) |
| H01L 31/036 | (2006.01) |
| H01L 31/068 | (2012.01) |
| H01L 31/0224 | (2006.01) |
| H01L 31/0216 | (2014.01) |

(52) U.S. Cl.
CPC ...... H01L 31/02008 (2013.01); H01L 31/028 (2013.01); H01L 31/02168 (2013.01); H01L 31/022425 (2013.01); H01L 31/036 (2013.01); H01L 31/068 (2013.01); H01L 31/1804 (2013.01)

(58) Field of Classification Search
CPC ......... H01L 31/02008; H01L 31/02168; H01L 31/022425; H01L 31/028; H01L 31/036; H01L 31/068; H01L 31/1804
See application file for complete search history.

(56) References Cited

U.S. PATENT DOCUMENTS

| | | | | |
|---|---|---|---|---|
| 8,906,779 | B2* | 12/2014 | Bedell | H01L 27/142 257/21 |
| 2010/0108134 | A1* | 5/2010 | Ravi | H01L 31/02242 136/256 |
| 2012/0118383 | A1* | 5/2012 | Bedell | H01L 31/02008 136/261 |
| 2013/0330872 | A1 | 12/2013 | Rana et al. | |
| 2014/0225211 | A1 | 8/2014 | Lau et al. | |

OTHER PUBLICATIONS

Bardeen, Electrical Conductivity of Metals, 1940, Journal of Applied Physics, vol. 11, pp. 88-111, published Feb. 1940.*

(Continued)

Primary Examiner — Nikolay Yushin
(74) Attorney, Agent, or Firm — Lorenz & Kopf, LLP

(57) ABSTRACT

Integrated circuits and methods of producing the same are provided. In an exemplary embodiment, an integrated circuit includes a substrate with a handle layer, a buried insulator layer overlying the handle layer, and an active layer overlying the buried insulator layer. The handle layer and the active layer include monocrystalline silicon. A transistor overlies the buried insulator layer, and a solar cell is within the handle layer such that the buried insulator layer is between the solar cell and the transistor. The solar cell includes a solar cell outer layer in electrical communication with a solar cell outer layer contact, and a solar cell inner layer in electrical communication with a solar cell inner layer contact. The solar cell inner and outer layers are monocrystalline silicon.

20 Claims, 5 Drawing Sheets

(56) References Cited

OTHER PUBLICATIONS

Bulteel et al., "High-Efficiency Solar Cell Embedded in SOI Substrate for ULP Autonomous Circuits", 2009, 2 pages.
Duan et al., "Ultrathin Crystalline Silicon Heterojunction Solar Cell Integrated on Silicon-on-Insulator Substrate", IEEE Transactions on Electron Devices, Apr. 2015, pp. 1113-1118, vol. 62, No. 4.
Lu et al., Integration of Solar Cells on Top of CMOS Chips Part I: a-Si Solar Cells, IEEE Transacitons on Electron Devices, Jul. 2011, pp. 2014-2021, vol. 58, No. 7.

* cited by examiner

INTEGRATED CIRCUITS WITH SOLAR CELLS AND METHODS FOR PRODUCING THE SAME

TECHNICAL FIELD

The technical field generally relates to integrated circuits with solar cells and methods of producing the same, and more particularly relates to integrated circuits with monocrystalline silicon solar cells and methods of producing the same.

BACKGROUND

Electricity powers the operation of integrated circuits. However, some integrated circuits are used where a reliable supply of electricity is not available or is not desirable. For example, the internet of things involves the interconnection of computing devices embedded in many consumer products via the internet, such as wearable devices, wireless sensors, etc. This interconnection may be facilitated by relatively low power devices with long term, portable power supplies. Electricity can be provided by a battery or a hard-wired electrical supply, but batteries are eventually drained and hard-wired electrical supplies are not available at all locations and have limited mobility.

An integrated circuit capable of producing its own electricity could be utilized in locations were hard-wire electrical supplies are not available or not desirable, and where monitoring and changing a battery as needed is also not desirable. One technique available for remote electrical supply is the use of solar cells. Solar cells produce electricity from light, but the quantity of electricity produced depends on the area and the efficiency of the solar cell. The size of integrated circuits is decreasing as time goes by, so less space is available for solar cells on integrated circuits.

Accordingly, it is desirable to provide integrated circuits with solar cells that (1) efficiently utilize available space and (2) produce electricity from light efficiently. In addition, it is desirable to provide integrated circuits with solar cells where the solar cell production is inexpensive and utilizes components and materials already in use in the integrated circuit. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a substrate with a handle layer, a buried insulator layer overlying the handle layer, and an active layer overlying the buried insulator layer. The handle layer and the active layer include monocrystalline silicon. A transistor overlies the buried insulator layer. A solar cell is within the handle layer and is positioned such that the buried insulator layer is between the solar cell and the transistor. The solar cell includes a solar cell outer layer in electrical communication with a solar cell outer layer contact, and a solar cell inner layer in electrical communication with a solar cell inner layer contact. The solar cell inner and outer layers are monocrystalline silicon.

An integrated circuit is provided in another embodiment. The integrated circuit includes a substrate with a handle layer, a buried insulator layer overlying the handle layer, and an active layer overlying the buried insulator layer. A transistor overlies the buried insulator layer, where the transistor includes a source, a drain, a gate, and a channel underlying the gate. A solar cell is within the handle layer such that the buried insulator layer is between the solar cell and the transistor. The solar cell includes a solar cell outer layer in electrical communication with a solar cell outer layer contact, and a solar cell inner layer in electrical communication with a solar cell inner layer contact. The channel is closer to the solar cell than the gate.

A method of producing an integrated circuit is provided in yet another embodiment. The method includes forming a transistor overlying a buried insulator layer, and forming a solar cell underlying the buried insulator layer such that the buried insulator layer is between the solar cell and the transistor. The solar cell includes a solar cell outer layer in electrical communication with a solar cell outer layer contact, and a solar cell inner layer in electrical communication with a solar cell inner layer contact. The solar cell inner and outer layers primarily include different types of conductivity determining impurities, and the solar cell inner and outer layers are monocrystalline silicon.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details. In exemplary embodiments described herein, a monocrystalline silicon solar cell is formed in a handle layer side of a silicon-on-insulator (SOI) substrate.

Figure 1:
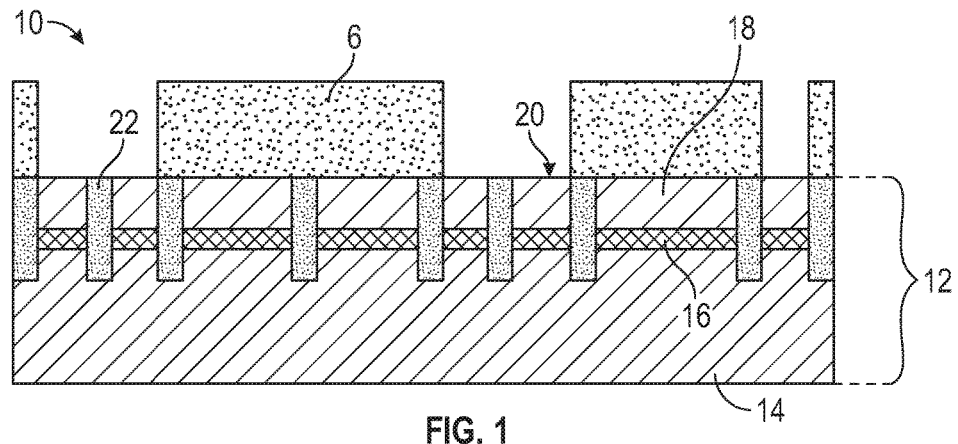
FIGS. 1-9 illustrate, in cross sectional views, an integrated circuit and methods of producing the same in accordance with exemplary embodiments.

Reference is made to an exemplary embodiment illustrated in a side sectional view in FIG. 1. An integrated circuit 10 includes a silicon on insulator substrate 12 (SOI substrate), where the SOI substrate 12 includes a handle layer 14, a buried insulator layer 16 overlying the handle layer 14, and an active layer 18 overlying the buried insulator layer 16. As used herein, the term "overlying" means "over" such that an intervening layer may lie between the overlying component (the active layer 18 in this example) and the underlying component (the buried insulator layer 16 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, so reference to a "vertical" line means a line that is about perpendicular to a substrate surface 20. Generally, the integrated circuit 10 can be operated in any orientation. Spatially relative terms, such as "top", "bottom", "over" and "under" are made in the context of the orientation of the figures. It will be understood that the spatially relative terms are intended to encompass different orientations of the device in use or operation in addition to the orientation depicted in the figures. Thus, the exemplary terms "over" and "under" can each encompass either an orientation of above or below depending upon the orientation of the device. The device may be otherwise oriented (e.g., rotated 90 degrees or at other orientations) and the spatially relative descriptors used herein may likewise be interpreted accordingly.

In an exemplary embodiment, the active layer 18 includes a monocrystalline silicon material, but other materials may be used in alternate embodiments. "Monocrystalline silicon," as used herein, is a material that primarily includes silicon (50 weight percent or more silicon), where other materials may be present in the silicon, such as conductivity determining impurities (dopants), or other impurities. The monocrystalline silicon has an extended crystalline structure, where the conductivity determining impurities and/or other impurities may be incorporated into the crystalline structure. Monocrystalline silicon may have more than one crystal structure, such that a fracture or gap in the crystal may be tolerated, but a continuous crystalline structure dominates the material as opposed to discrete crystals in a matrix. The monocrystalline silicon may include conductivity determining impurities at various concentrations, where the concentration of conductivity determining impurities may be sufficient to make the monocrystalline silicon semiconductive or conductive in different embodiments.

A conductive material generally has a resistivity of about $1 \times 10^4$ ohm meters or less, an insulating material generally has a resistivity of about $1 \times 10^4$ ohm meters or more, and a semiconductive material has a resistivity of between about $1 \times 10^4$ ohm meters to about $1 \times 10^4$ ohm meters. The buried insulator layer 16 is an electrical insulator and includes electrically insulating material, such as silicon dioxide in an exemplary embodiment, but sapphire or other electrically insulating materials may be used in alternate embodiments. The handle layer 14 provides mechanical strength and stability to the SOI substrate 12, and includes monocrystalline silicon in an exemplary embodiment. The handle layer 14 is also a semiconductive material in an exemplary embodiment. "Semiconductor materials" include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like.

One or more shallow trench isolation structures 22 are positioned within the substrate 12. The shallow trench isolation structure 22 is an electrical insulator, and includes silicon dioxide in some embodiments, but other materials are used in alternate embodiments. The shallow trench isolation structure 22 extends from about the substrate surface 20 through the active layer 18 and the buried insulator layer 16 into the handle layer 14 in the illustrated embodiment, but the shallow trench isolation structure 22 may terminate at the buried insulator layer 16 or at other locations in alternate embodiments.

A contact photoresist layer 6 is formed and patterned overlying the substrate 12. The contact photoresist layer 6 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the contact photoresist layer 6 remains overlying the other areas of the substrate 12. The contact photoresist layer 6 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

Figure 2:
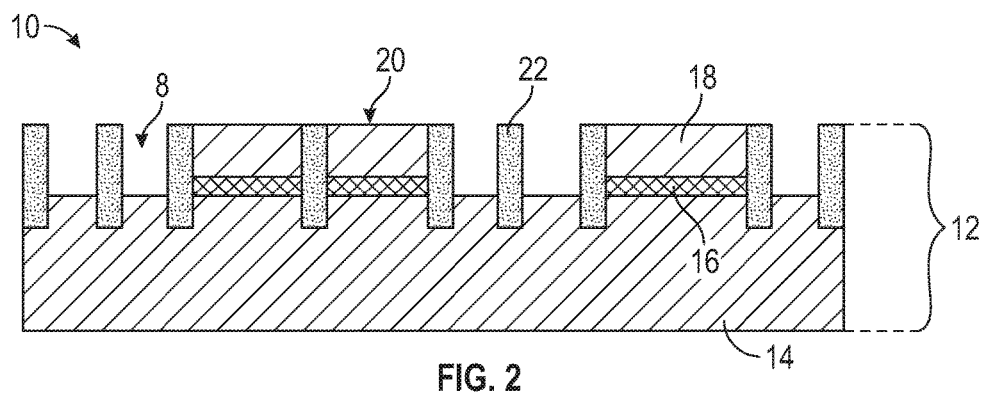

Referring to an exemplary embodiment illustrated in FIG. 2, with continuing reference to FIG. 1, one or more contact locations 8 are formed by removing the active layer 18 and the buried insulator layer 16 from the contact locations 8. The contact locations 8 are portions of the substrate 12 where the active layer 18 and the buried insulator layer 16 have been removed to expose the handle layer 14 from the top. The active layer 16 and buried insulator layer 16 are selectively removed with a reactive ion etch using an etchant selective to the materials of the active layer 16 and the insulator layer 16, respectively. The contact locations 8 are more fully developed and incorporated into the integrated circuit 10 as described below. In some embodiments, the contact locations 8 are positioned between adjacent shallow trench isolation structures 22, where the contact location 8 extends from one shallow trench isolation structure 22 to an adjacent shallow trench isolation structure.

Figure 3:
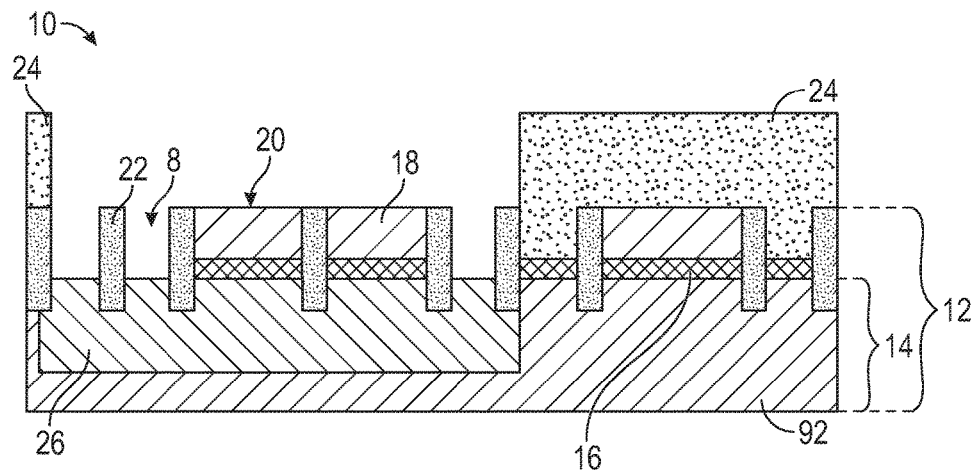

An optional deep solar well photoresist layer 24 is formed and patterned overlying the substrate 12, as illustrated in an exemplary embodiment in FIG. 3. An optional deep solar well 26 is formed within the handle layer 14 of the substrate 12 through the opening of the deep solar well photoresist layer 24. The handle layer 14 includes a conductivity determining impurity, and the deep solar well 26 includes a different type of conductivity determining impurity such that a P-N junction is formed between the deep solar well 26 and the underlying handle layer 14. The total concentration of conductivity determining impurities (total of both types) is greater in the deep solar well 26 than in the underlying handle layer 14, as is generally true for wells formed within a different well or within a substrate. In an exemplary embodiment, the handle layer 14 primarily includes P type conductivity determining impurities and the deep solar well 26 primarily includes N type conductivity determining impurities, but the opposite may be true in alternate embodiments. As used herein, the term "primarily," when referencing P and/or N type conductivity determining impurities, means more of the referenced conductivity determining impurity is present than the other type of conductivity determining impurity. When referencing a component in general, the term "primarily" means the component includes the recited element or material at a concentration of about 50 weight percent or more, based on the total weight of the component. The concentration of P type conductivity determining impurities in the handle layer 14 is less than the concentration of N type conductivity determining impurities in the deep solar well 26, so the N type conductivity determining impurities are primarily responsible (compared to the remaining P type conductivity determining impurities) for the behavior deep solar well 26.

In an exemplary embodiment, the deep solar well 26 is formed by implanting "N" type conductivity determining impurities (i.e. dopants) as ions through the substrate surface 20. "N" type conductivity determining impurities typically include phosphorous, arsenic, and/or antimony, but other materials could also be used. "P" type conductivity determining impurities typically include boron, aluminum, gallium, and indium, but other materials could also be used. Ion implantation involves ionizing the conductivity determining impurity and propelling the ion into the substrate 12 under the influence of an electrical field. The deep solar well 26 may then be annealed to repair crystal damage from the ion implantation process, to electrically activate the conductivity determining impurities, and to redistribute the conductivity determining impurities within the semiconductor material. As such, the deep solar well 26 includes monocrystalline silicon after the ion implantation and annealing process. The annealing process can use widely varying temperatures, such as temperatures ranging from about 500 degrees centigrade (° C.) to about 1,200° C. In alternate embodiments, the annealing process is delayed until other wells are formed. The portions of the handle layer 14 that are not implanted with conductivity determining impurities form a solar cell outer layer 92, as described more fully below. As such, the solar cell outer layer 92 includes conductivity determining impurities at a concentration less than that of the deep solar well 26 and less than that of all the other wells described below.

Figure 4:
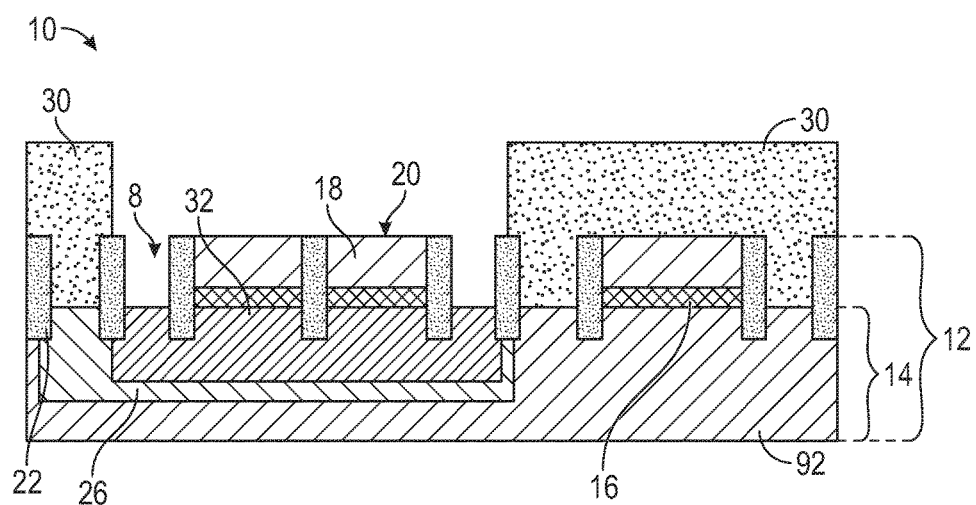

FIG. 4 illustrates an embodiment with an optional deep bias well photoresist layer 30 formed and patterned overlying the substrate 12. An optional deep bias well 32 is then formed in the handle layer 14 by implanting conductivity determining impurities such that the primary conductivity determining impurity in the deep bias well 32 is different than that in the deep solar well 26. This produces a P-N junction between the deep solar well 26 and the deep bias well 32. In the illustrated embodiment, the deep solar well 26 underlies all of the deep bias well 32, both of which underlie the buried insulator layer 16. The P-N junction between the deep solar well 26 and the deep bias well 32 serves to prevent the operation of the deep solar well 26 from interfering with the operation of the electrical components overlying the deep bias well 32 and the buried insulator layer 16 directly overlying the deep bias well 32.

Figure 5:
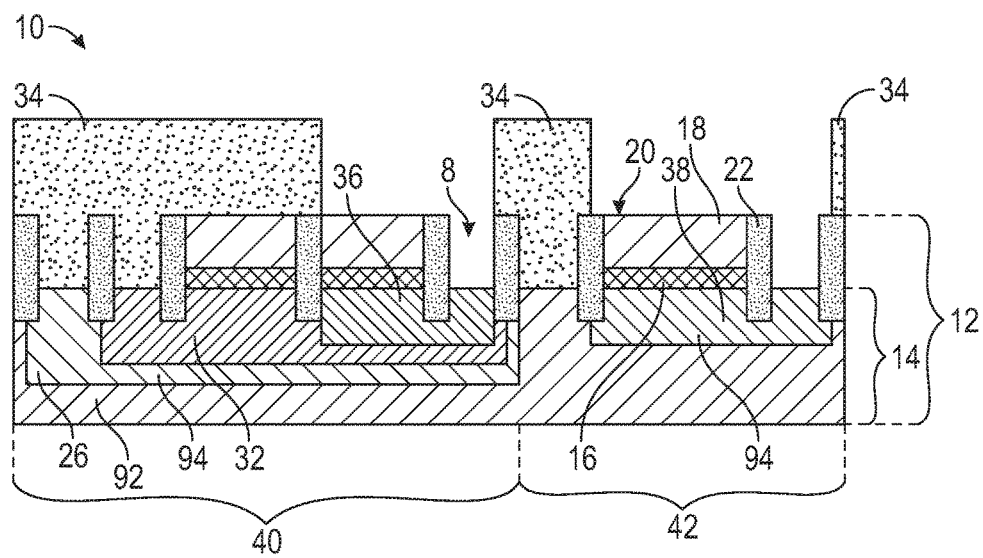

An optional shallow well photoresist layer 34 is formed and patterned overlying the substrate 12, as illustrated in FIG. 5. Conductivity determining impurities are optionally then implanted into the handle layer 14 through the substrate surface 20 to form one or more of a shallow bias well 36 and/or a shallow solar well 38. The shallow bias well 36 and the shallow solar well 38 primarily include the opposite type of conductivity determining impurity as the solar cell outer layer 92. The shallow bias well 36 is differentiated from the shallow solar well 38 by the position relative to the solar cell outer layer 92. The shallow bias well 36 is positioned within the deep bias well 32. Therefore, the shallow bias well 36 does not make direct contact with the solar cell outer layer 92 so the shallow bias well 36 is separated from the solar cell outer layer 92. In the illustrated embodiment, the shallow bias well 36 is separated from the solar cell outer layer 92 by both the deep solar well 26 and the deep bias well 32. The shallow solar well 38 directly contacts the solar cell outer layer 92 and forms a P-N junction at the intersection between the shallow solar well 38 and the solar cell outer layer 92.

The deep bias well 32 and the shallow bias well 36 are both referred to herein as a bias well, and the deep solar well 26 and the shallow solar well 38 are both referred to herein as a solar cell inner layer 94. The illustrated integrated circuit 10 includes a first side 40 and a second side 42, where the first side 40 includes the bias well(s) and the second side 42 is free of bias wells. In embodiments where the integrated circuit 10 includes bias wells, the bias wells are positioned between the deep solar well 26 and the buried insulator layer 16, so embodiments with a bias well also include a deep solar well 26. The illustrated embodiment of the first side 40 includes the deep bias well 32 and the shallow bias well 36, but in alternate embodiments with bias wells there may be one or more bias wells between the deep solar well 26 and the buried insulator layer 16. In some embodiments, the integrated circuit 10 may include one or more deep solar well(s) 32 but no shallow solar wells 38, or the integrated circuit 10 may include both deep and shallow solar wells 26, 38, or the integrated circuit 10 may include no deep solar wells 26 and only one or more shallow solar wells 38. The illustrated embodiment includes both deep and shallow solar wells 26, 38 to illustrate different embodiments that are possible. The integrated circuit 10 includes both a solar cell outer layer 92 and some form of a solar cell inner layer 94 in all embodiments.

Figure 6:
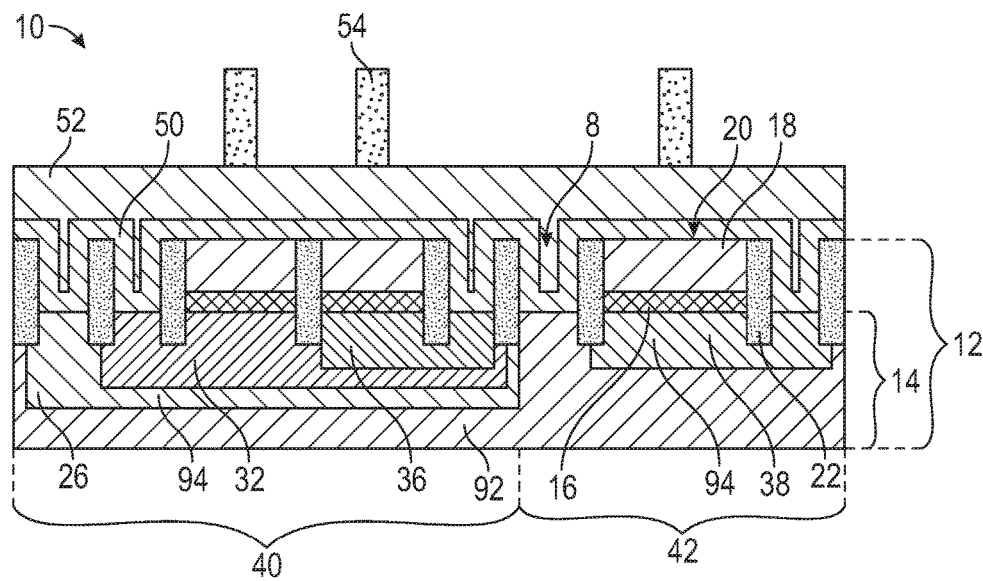

Referring to FIG. 6, a gate insulator layer 50 is formed overlying the substrate 12 and within the contact locations 8, and a gate layer 52 is formed overlying the gate insulator layer 50. The gate insulator layer 50 is an electrical insulator and the gate layer 52 is an electrical conductor. In one embodiment, the gate insulator layer 50 includes a high K dielectric material, which may be formed by atomic layer deposition, but other insulating materials may be used in alternate embodiments, such as thermal silicon dioxide. One exemplary high K dielectric material is hafnium oxide, which can be deposited by atomic layer deposition using tetrakis(dimethylamido) hafnium and water, but other high K dielectric materials are also possible. The gate layer 52 may include polysilicon with conductivity determining impurities at a concentration that is at least sufficient to make the gate layer 52 electrically conductive, where polysilicon may be formed by low pressure chemical vapor deposition in a silane environment. In an alternate embodiment, the gate layer 52 may be a sacrificial layer that is replaced with a replacement metal gate, and other conductive materials are also possible.

Figure 7:
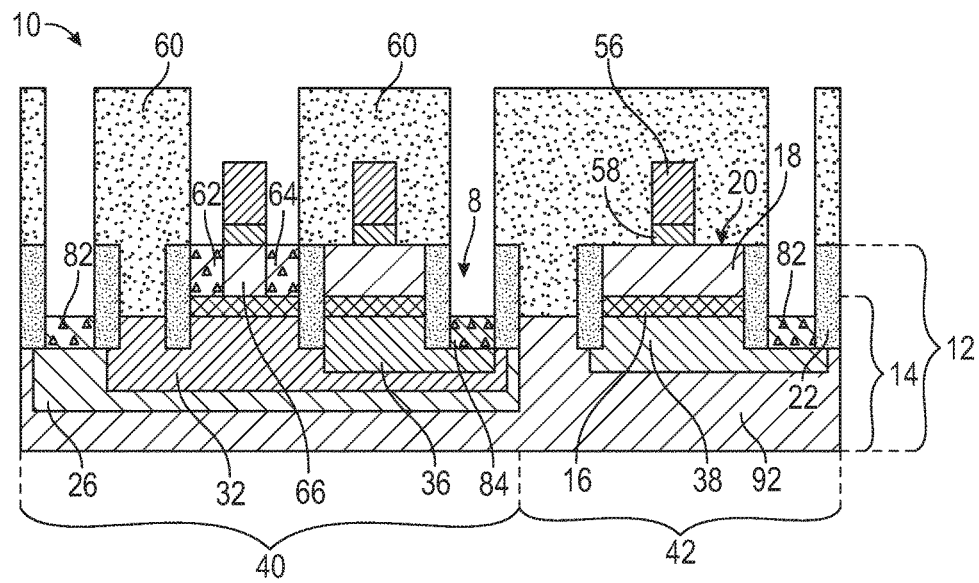

A gate photoresist layer 54 is then formed and patterned overlying the gate layer 52. The portions of the gate layer 52 and the gate insulator layer 50 that are not covered by the gate photoresist layer 54 are then removed to form a gate 56 and a gate insulator 58, as illustrated in FIG. 7 with continuing reference to FIG. 6. The gate layer 52 may be removed with a plasma etch using hydrogen bromide in embodiments with a polysilicon gate layer 52, but many other etchants selective to polysilicon may be used in alternate embodiments. The gate insulator layer 50 may be removed with a reactive ion etch using carbon tetrafluoride in embodiments with a silicon dioxide gate insulator layer 50, but other etchants or etch techniques may also be utilized.

A first source/drain photoresist layer 60 may be formed overlying the substrate 12, as illustrated in FIG. 7. A source 62 and a drain 64 may then be formed in the active layer 18 by implanting conductivity determining impurities in the areas exposed by the first source/drain photoresist layer 60. Conductivity determining impurities are also implanted into the handle layer 14 to form a solar cell inner layer contact 82 and a shallow bias well contact 84. A channel 66 is positioned underlying the gate 56 between the source 62 and the drain 64. In the illustrated embodiment, the source 62 and drain 64 formed with the first source/drain photoresist layer 60, as well as the solar cell inner layer contact 82 and the shallow bias well contact 84, all primarily include "N" type conductivity determining impurities. In an alternate embodiment, a mask is formed and lithographically patterned, and the source 62, the drain 64, the solar cell inner layer contact 82, and the shallow bias well contact 84 may be formed by epitaxial growth from the underlying monocrystalline silicon. The source 62, drain 64, solar cell inner layer contact 82, and the shallow bias well contact 84 are electrical conductors, and other techniques for forming them are also possible.

The solar cell inner layer contact(s) 82 (one for the deep solar well 26 and the other for the shallow solar well 38 in the illustrated embodiment) include a solar cell inner layer contact 82 in electrical communication with the deep solar well 26 on the first side 40 of the integrated circuit, and another solar cell inner layer contact 82 in electrical communication with the shallow solar well 38 on the second side 42 of the integrated circuit. The shallow bias well contact 84 is in electrical communication with the shallow bias well 36. The formation of the deep and shallow solar wells 26, 38 and the deep and shallow bias wells 32, 36 has been described above. Each of these wells directly touch a contact, including the solar cell inner layer contact(s) 82 for the deep and shallow solar wells 26 and 38 and the shallow bias well contact 84 for the shallow bias well 36. The wells and the contacts that touch each other primarily include the same type of conductivity determining impurity, and the contacts are available for integrating the various wells into the integrated circuit 10.

Figure 8:
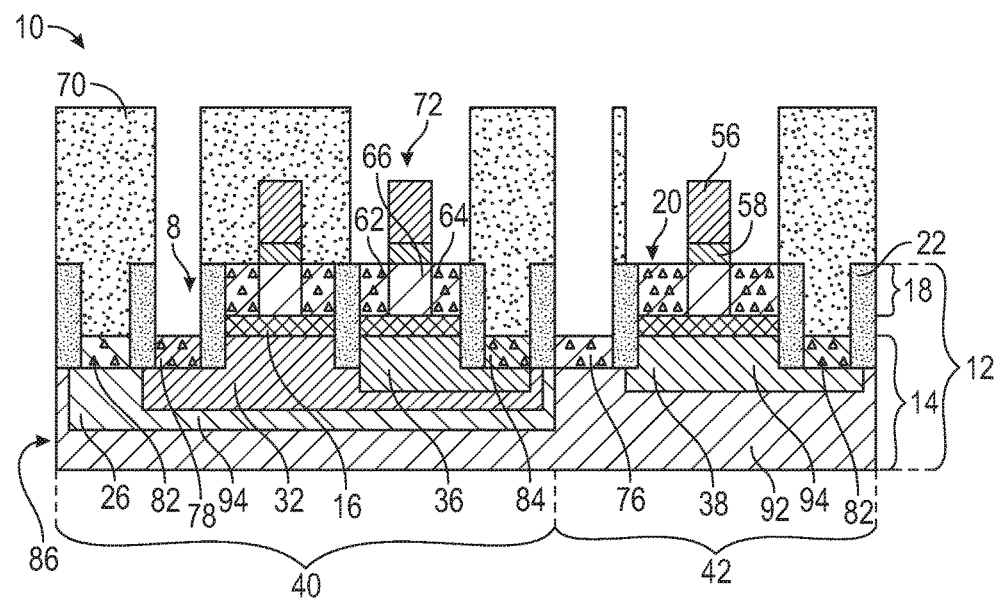

A second source/drain photoresist layer 70 may then be formed and patterned overlying the substrate 12, as illustrated in FIG. 8. A source 62 and drain 64 may then be formed in the active layer 18 with the opposite type of conductivity determining impurities as that used with the first source/drain photoresist layer 60, such as "P" type conductivity determining impurities in an exemplary embodiment The second source/drain photoresist layer 70 is also patterned to expose the handle layer 14 through the contact locations 8, and contacts that primarily include the same type of conductivity determining impurity as the source 62 and drain 64 are also formed. In the illustrated embodiment with "P" type conductivity determining impurities, a solar cell outer layer contact 76 and a deep bias well contact 78 are formed. The solar cell outer layer contact 76 is in electrical communication with the solar cell outer layer 92, and the deep bias well contact 78 is in electrical communication with the deep bias well 32. In an alternate embodiment, a mask may be formed and the source 62, drain 64, solar cell outer layer contact 76, and the deep bias well contact 78 may be formed epitaxially, as mentioned above.

All the contacts formed primarily include the same type of conductivity determining impurity as the associated well, as mentioned above. The integrated circuit 10 also includes one or more transistors 72 formed in the active layer 18 overlying the buried insulator layer 16, where both "N" and "P" type transistors 72 are included. Forming the contacts at the same time as the source 62 and drain 64 helps minimize the number of lithography processes required, but other production techniques are also possible. Other types of electronic components (not illustrated) may also be formed overlying the buried insulator layer 16, such as capacitors, resistors, diodes, inductors, fuses, memory cells, etc. Other types of transistors 72 or techniques for producing transistors 72 may be utilized in alternate embodiments. Many transistor structures and production techniques are available in alternate embodiments, such as forming a transistor 72 with a fin, forming a transistor with a replacement metal gate, etc.

In one exemplary embodiment, the solar cell outer layer 92, the solar cell outer layer contact 76, the deep bias well 32, and deep bias well contact 78 primarily include "P" type conductivity determining impurities. The deep and shallow solar wells 26, 38, the solar cell inner layer contact(s) 82, the shallow bias well 36, and the shallow bias well contact 84 primarily include "N" type conductivity determining impurities. The opposite is also possible, and alternate embodiments with more or fewer wells are also possible. In general, each successive well has the opposite type of conductivity determining impurity compared to the adjacent well(s).

In this description, the deep and shallow solar wells 26, 38 are referred to as a "solar cell inner layer 94," and the handle layer 14 outside of the wells formed therein is referred to as a "solar cell outer layer 92," as mentioned above. The solar cell outer layer 92 is the layer first contacted by light external to the integrated circuit 10. A solar cell 86 is formed from the solar cell inner layer 94 and the solar cell outer layer 92, combined with the electrical connections for each. The electrical connections are the solar cell inner layer contact 82 and the solar cell outer layer contact 76. As described herein, the solar cell inner and outer layers 94, 92 primarily include different types of conductivity determining impurities, and the associated solar cell inner and outer layer contacts 82, 76 may be incorporated into a power supply for the integrated circuit 10. For example, the solar cell inner and outer layer contacts 82, 76 may be in electrical communication with a capacitor (not illustrated) for temporary storage of electrical power. The solar cell inner and outer layers are monocrystalline silicon, so the solar cell 86 is a monocrystalline silicon type of solar cell.

Figure 9:
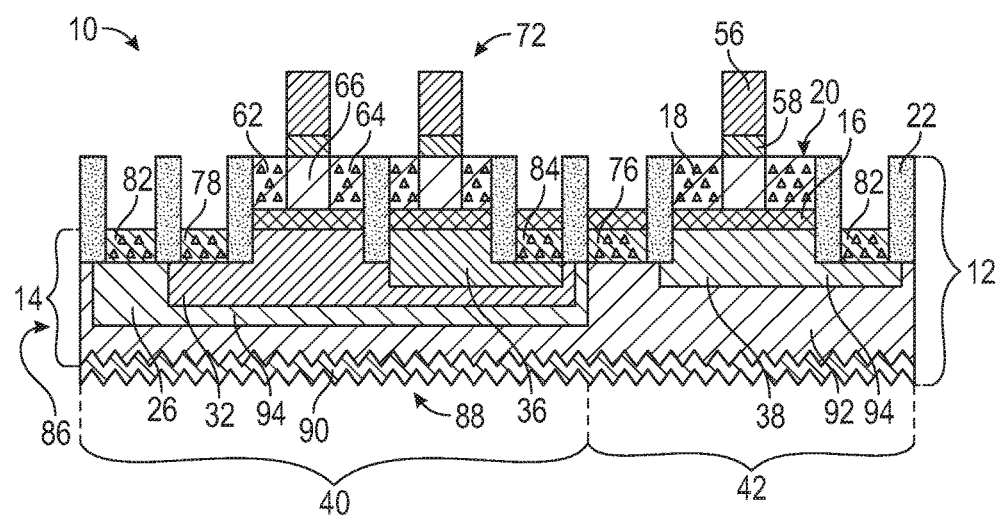

Various other techniques may be optionally utilized to improve the performance of the solar cell 86, as illustrated in an exemplary embodiment in FIG. 9. A solar cell light surface 88 is the bottom surface of the handle layer 14 and the solar cell outer layer 92, and the entire bottom surface of the handle layer 14 (the solar cell light surface 88) can be utilized in the solar cell 86. In the illustrated embodiment, the solar cell light surface 88 is etched to form a jagged surface, and a solar cell antireflective coating 90 is formed at the solar cell light surface 88 in direct contact with the solar cell outer layer 92. In this description, the solar cell antireflective coating 90 is considered part of the solar cell 86, but the solar cell antireflective coating 90 is optional. In an exemplary embodiment, the solar cell light surface 88 is made jagged, as this has been found to reduce reflection and increase the overall efficiency of the solar cell 86. A jagged surface may be formed with a reactive ion etch using silicon hexafluoride and oxygen, but other techniques are also available. The solar cell antireflective coating 90 may include silicon nitride, which may be deposited by reactive ion etch using ammonia and dichlorosilane. The solar cell antireflective coating 90 may include different materials, or additional layers, in alternate embodiments. The optional jagged surface and/or solar cell antireflective coating 90 may be formed at almost any stage in the integrated circuit manufacturing process, because these techniques are applied to the bottom of the handle layer 14.

The solar cell 86 and the transistor 72 are on opposite sides of the buried insulator layer 16, where the transistor 72 includes a channel 66 and a gate 56. The channel 66 is closer to the solar cell 86 than the gate 56, because the solar cell 86 underlies the transistor 72 and the buried insulator layer 16. Using the handle layer 14 for the solar cell 86 has advantages. The energy produced by a solar cell is related to the surface area of that solar cell. In the embodiments described above, no surface area is sacrificed for positioning of electronic components such as the transistor 72, because the integrated circuit 10 may be mounted with the solar cell light surface 88 facing outward toward potential light sources. As such, the integrated circuit 10 includes a monocrystalline silicon type solar cell 86, which is a relatively efficient type of solar cell 86, combined with a large surface area of the solar cell light surface 88. The surface area of the solar cell light surface 88 is about the same as the surface area of the entire integrated circuit 10. The combination of a large solar cell light surface 88 with an efficient type of solar cell 86 provides a relatively large, remote power supply for the integrated circuit 10.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
    a substrate comprising a handle layer, a buried insulator layer overlying the handle layer, and an active layer overlying the buried insulator layer, wherein the handle layer comprises monocrystalline silicon and the active layer comprises monocrystalline silicon;
    a transistor overlying the buried insulator layer;
    a solar cell within the handle layer such that the buried insulator layer is between the solar cell and the transistor, wherein the solar cell comprises a solar cell outer layer in electrical communication with a solar cell outer layer contact, a solar cell inner layer in electrical communication with a solar cell inner layer contact, and wherein the solar cell inner layer and the solar cell outer layer are monocrystalline silicon;
    a deep bias well underlying the buried insulator layer and the transistor, wherein the deep bias well overlies the solar cell inner layer; and
    a deep bias well contact in electrical communication with the deep bias well.

2. The integrated circuit of claim 1 wherein:
    the solar cell outer layer contact and the solar cell outer layer primarily comprise the same type of conductivity determining impurity; and
    the solar cell inner layer contact and the solar cell inner layer primarily comprises the same type of conductivity determining impurity.

3. The integrated circuit of claim 1 further comprising:
    a solar cell light surface on the solar cell outer layer; and
    an antireflective layer contacting the solar cell light surface.

4. The integrated circuit of claim 3 wherein the solar cell light surface is jagged.

5. The integrated circuit of claim 1:
    wherein the deep bias well and the solar cell inner layer primarily include different types of conductivity determining impurities.

6. The integrated circuit of claim 1 further comprising:
    a shallow bias well underlying the transistor, wherein the shallow bias well overlies the deep bias well; and
    a shallow bias well contact in electrical communication with the shallow bias well.

7. The integrated circuit of claim 1 wherein the solar cell outer layer primarily comprises P type conductivity determining impurities and the solar cell inner layer primarily comprises N type conductivity determining impurities.

8. The integrated circuit of claim 7 further comprising:
    a deep bias well underlying the buried insulator layer, wherein the deep bias well primarily comprises P type conductivity determining impurities.

9. The integrated circuit of claim 1 wherein:
    wherein the solar cell outer layer and the solar cell inner layer primarily include different types of conductivity determining impurities.

10. The integrated circuit of claim 1 wherein:
    the transistor comprises a source, a drain, a gate, and a channel underlying the gate, wherein the channel comprises monocrystalline silicon.

11. The integrated circuit of claim 10 wherein the channel is closer to the solar cell than the gate.

12. The integrated circuit of claim 1 wherein the solar cell inner layer comprises:
    a shallow solar well contacting the buried insulator layer; and
    a deep solar well.

13. The integrated circuit of claim 12 further comprising:
    a deep bias well positioned between the deep solar well and the buried insulator layer.

14. An integrated circuit comprising:
    a substrate comprising a handle layer, a buried insulator layer overlying the handle layer, and an active layer overlying the buried insulator layer;
    a transistor overlying the buried insulator layer, wherein the transistor comprises a source, a drain, and gate, and a channel underlying the gate; and
    a solar cell within the handle layer such that the buried insulator layer is between the solar cell and the transistor, wherein the solar cell comprises a solar cell outer layer in electrical communication with a solar cell outer layer contact, a solar cell inner layer in electrical communication with a solar cell inner layer contact, wherein the channel is closer to the solar cell than the gate is to the solar cell, wherein the solar cell inner layer comprises a shallow solar well contacting the buried insulator layer, and wherein the solar cell inner layer further comprises a deep solar well.

15. The integrated circuit of claim 14 wherein:
    the solar cell outer layer is monocrystalline silicon; and
    the solar cell inner layer is monocrystalline silicon.

16. The integrated circuit of claim 14 wherein:
the solar cell outer layer comprises a solar cell light surface; and wherein
the solar cell further comprises an antireflective layer contacting the solar cell light surface.

17. The integrated circuit of claim 14 further comprising:
a deep bias well positioned between the solar cell inner layer and the buried insulator layer.

18. The integrated circuit of claim 17 further comprising:
a shallow bias well positioned between the deep bias well and the buried insulator layer, wherein the shallow bias well primarily comprises the same type of conductivity determining impurity as the solar cell inner layer.

19. The integrated circuit of claim 17 further comprising:
a deep bias well contact in electrical communication with the deep bias well.

20. A method of producing an integrated circuit comprising:
forming a transistor overlying a buried insulator layer;
forming a deep bias well underlying the buried insulator layer and the transistor;
forming a deep bias well contact in electrical communication with the deep bias well; and
forming a solar cell underlying the buried insulator layer such that the buried insulator layer is between the solar cell and the transistor, wherein the solar cell comprises a solar cell outer layer in electrical communication with a solar cell outer layer contact, a solar cell inner layer in electrical communication with a solar cell inner layer contact, wherein the solar cell outer layer and the solar cell inner layer primarily include different types of conductivity determining impurities, wherein the solar cell inner layer and the solar cell outer layer are monocrystalline silicon, and wherein the solar cell inner layer underlies the deep bias well.

* * * * *